United States Patent [19]

King et al.

[11] 4,388,386

[45] Jun. 14, 1983

[54] MASK SET MISMATCH

[75] Inventors: Bruce D. King, Burlington; James P. Levin, Shelburne, both of Vt.

[73] Assignee: International Business Machines Corporation, Armonk, N.Y.

[21] Appl. No.: 385,591

[22] Filed: Jun. 7, 1982

[51] Int. Cl.³ .............................................. G03C 5/06
[52] U.S. Cl. ......................................... 430/5; 430/22; 356/401; 356/399; 355/40
[58] Field of Search ...................... 430/5, 22; 250/558, 250/557; 356/399, 400, 401; 355/43, 45, 40, 41

[56] References Cited

U.S. PATENT DOCUMENTS

| | | | |
|---|---|---|---|
| 4,070,117 | 1/1978 | Johannsmeier et al. | 356/172 |
| 4,103,998 | 8/1978 | Nakazawa et al. | 356/152 |
| 4,134,066 | 1/1979 | Vogel et al. | 324/210 |
| 4,153,367 | 5/1979 | Lietar et al. | 356/400 |
| 4,193,687 | 5/1980 | Reekstin et al. | 356/150 |
| 4,251,160 | 2/1981 | Bouwhuis et al. | 356/401 |

OTHER PUBLICATIONS

Coffey, P. H., "An X-Y Measuring System," Kodak Micro-Electronics Seminar Proceedings, Oct. 1-3, 1978, pp. 1-14.
Rottmann, H. R., "Overlay in Lithography," Semiconductor International, Dec. 1980, pp. 83-94.

Primary Examiner—John E. Kittle
Assistant Examiner—José Dees
Attorney, Agent, or Firm—Francis J. Thornton

[57] ABSTRACT

A method for marking a mask set to insure minimum mismatch between the masks when they are assembled into a set. Each mask in the set is evaluated against a known fixed standard, identified and marked such that when the set is assembled and utilized to produce an integrated circuit minimum mismatch between each element in each mask in the set will be realized.

10 Claims, 6 Drawing Figures

MASK SET MISMATCH

This invention relates generally to integrated circuit fabrication and and more particularly to the mark and mask sets used to produce such integrated circuits.

BRIEF DESCRIPTION OF THE PRIOR ART

At the present time photo-lithographic techniques are used to produce integrated circuits or fields of circuits in semiconductor wafers. These wafers can contain upwards of two hundred distinct fields. The photo techniques used require that the devices forming the circuits in each field be created by using a series or set of masks. Each mask is used to form a portion of the circuit or field. By the proper sequencing of the masks the circuit or field is ultimately formed.

For example, in producing a bipolar resistor, a first mask is used to define the transistor's collector region, the second mask to define its base region, a third mask to define its emitter region, a fourth mask to define via openings in any passivation layer overlying these regions and a fifth mask to define the contacts to the various regions. These or other masks may be used to define other circuit elements such as sources or claims for FET devices or resistors.

As the number of masks in the set increases and as the density of the circuit produced by the set increases it becomes more and more critical that each mask be more precisely aligned to the previous elements produced in the wafer by using prior masks.

At the present time each mask is provided with two separated symmetrical alignment areas each containing one or more alignment marks. The wafer is exposed to the first mask in the set to define on the surface of the wafer the alignment marks of the first mask. Each subsequent mask is then aligned with respect to this first established mask.

Because the masks are formed by so-called step and repeat techniques in which each field on the mask is independently created, corresponding fields on each mask in the set can be slightly misaligned with respect to each other. This misalignment is, in the present art, compensated for by making the circuit elements in each mask larger than is necessitated by electrical requirements.

It is beneficial to reduce as much as possible such misalignment, best overlay, of the respective corresponding fields in mask sets for by doing so smaller circuit elements with corresponding increases in circuit density, and speed, and decreases in cost can be obtained.

SUMMARY OF THE INVENTION

The invention as claimed is intended to remedy these drawbacks and it is therefore a primary advantage of the present invention to produce photo-lighographic mask sets for creating integrated circuits which will have minimum mismatch between the respective fields on the various masks in the sets by aligning each mask as formed to a known standard, forming an alignment in the form of a scale on each mask and forming a vernier scale on each subsequent mask which indicates which element on the vernier scale which must be aligned with the scale on the previous mask to minimize mismatch between each of the fields on the mask being aligned with respect to the fields of any previously used mask.

DESCRIPTION OF THE PREFERRED EMBODIMENT

Figure 1:
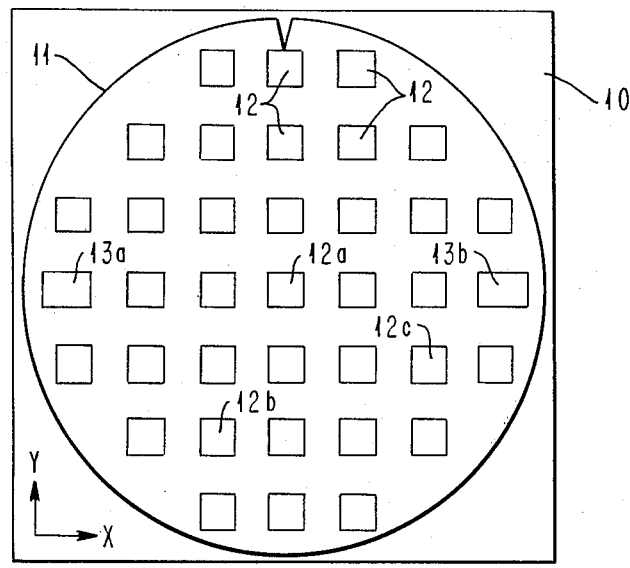
FIG. 1 shows a mask of the type that uses the present invention.

FIG. 1 shows a typical mask used in the production of semiconductor integrated circuits. Each mask is made on a square glass plate 10 with an image area defined by a circle 11 of a size substantially identical to the size of the semiconductor wafer being treated. Such masks have a number of image fields 12 which contain the images to be produced in the photoresist layer deposited on the semiconductor body being exposed through the mask. The images on the mask can be either positive or negative depending on the type of photoresist used. In addition to the image fields 12 there is, within image area 11, at least two alignment fields 13a and 13b.

Such masks are normally produced using so-called step and repeat cameras which are designed to precisely position the image fields in very precise locations with repeat to the left edge and the bottom edge of the chip. For the sake of example it will be assumed that the plate 10 is 8 inches by 8 inches and that each field has a centrally located alignment mark. This is ideally positioned on the mask everywhere the inch grid coordinates cross. For example, the alignment mark in the center of field 13a is designed to be $y=4.000000 X=1.000000$; the mark in field 12a $y=4.00000 X=4.000000$; the mark in field 13b $y=4.000000 X=7.000000$; the mark in field 12b $y=2.000000 X=3.000000$ and the mark in field 12c $y=3.000000$ and $x=6.000000$. However, because of mechanical inaccuracies in the step and repeat camera these field centers can be positioned as much as twenty or more microinches in any direction from its desired position. It is thus the purpose of this invention to attempt to minimize the effect of these positioning inaccuracies especially when arranging the mask in sets.

Figure 2:
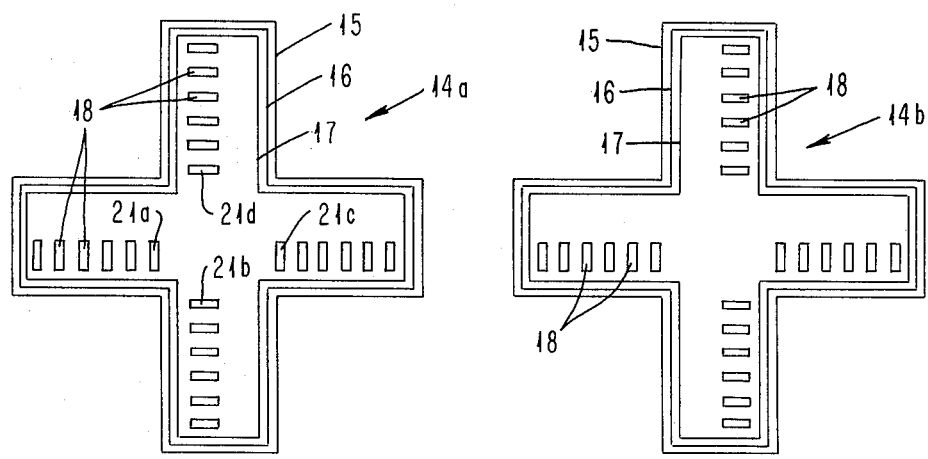
FIG. 2 shows the right and left alignment marks formed on a first mask.

Each of these alignment fields 13a and 13b contain at least one alignment mark and usually contains at least one mark for each mask in the final set. These marks can take many forms. FIG. 2 illustrates one such set of such alignment mark 14a and 14b as might be found in the respective alignment fields, 13a and 13b of a first mask. Alignment mark 14a would be in field 13a and mark 14b would be found in field 13b. Each mark is a mirror image of the other and is shown comprised of several nested, greek crosses 15, 16 and 17 with a number of parallel bars 18 in an arm is equally spaced from the adjacent marks in the arm.

Figure 3:
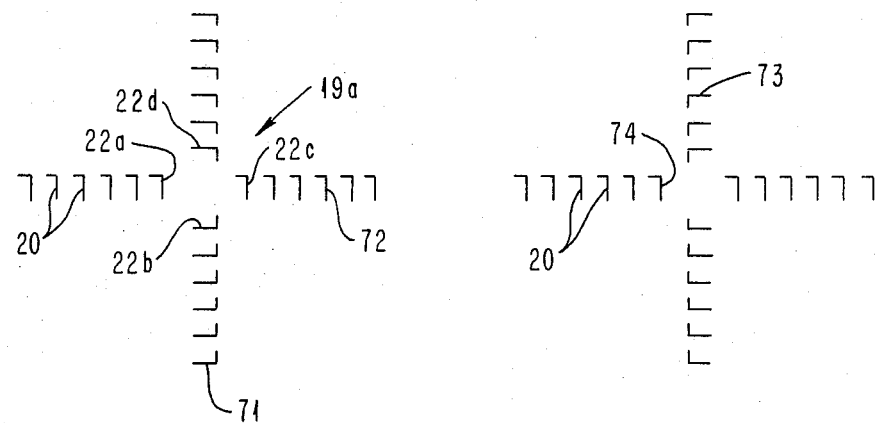
FIG. 3 shows the right and left vernier scale formed on a second and subsequent mask marked so as to minimize mismatch between the fields formed by the masks when aligned.

FIG. 3 illustrates one such set of alignment marks 19a and 19b as might be found in the respective alignment fields 13a and 13b of a second mask (not shown) that is to be aligned to the first mask of FIG. 1. These alignment marks comprises a series of generally L-shaped lines 20. To assure proper alignment and correct for drift as well as determine differential overlay, the alignment marks of the second mask should have a periodicity either increasing or declining spacing different from the spacing of the marks 14a and 14b of the first mask. When the spacing of the lines of the second mark set 19a and 19b have such a different periodicity from that of the first set a vernier is realized. In the prior art when such different periodicity of the marks were used the most central marks on such mask set represented the zero position, thus when these sets were to be precisely aligned with each other the central marks 22a, 22b, 22c, 22d of set 19a would be centered on the respective marks 21a, 21b, 21c, and 21d of mask 14a. The present invention differs from this in it treats the second set of alignment marks 19a and 19b to indicate which mark of the vernier must be centered on the corresponding mark of the first set as to minimize mismatch between the masks. For example in FIG. 6 the fourth vernier mark 23a of the right arm and the sixth vernier mark 23b of the lower arm is centered on the corresponding mark 24a and 24b of the first mask set. This will become clearer as the detailed description of the preferred procedures is explained below.

To practice the present invention the actual position of the center of each field and the centroid of all the fields on each mark must be determined.

To do so the first mask must be placed in an X-Y coordinate measuring system such as is sold by Nikon Corporation under the model name 2I. Another similar X-Y coordinate measuring system is described in detail in an article by P. H. Coffy, entitled "An X-Y Measurement System," which appears in pages 1-14 in the Kodak Microelectronics Seminar Proceedings, dated October 1-3, 1978, San Diego, California.

Figure 4:
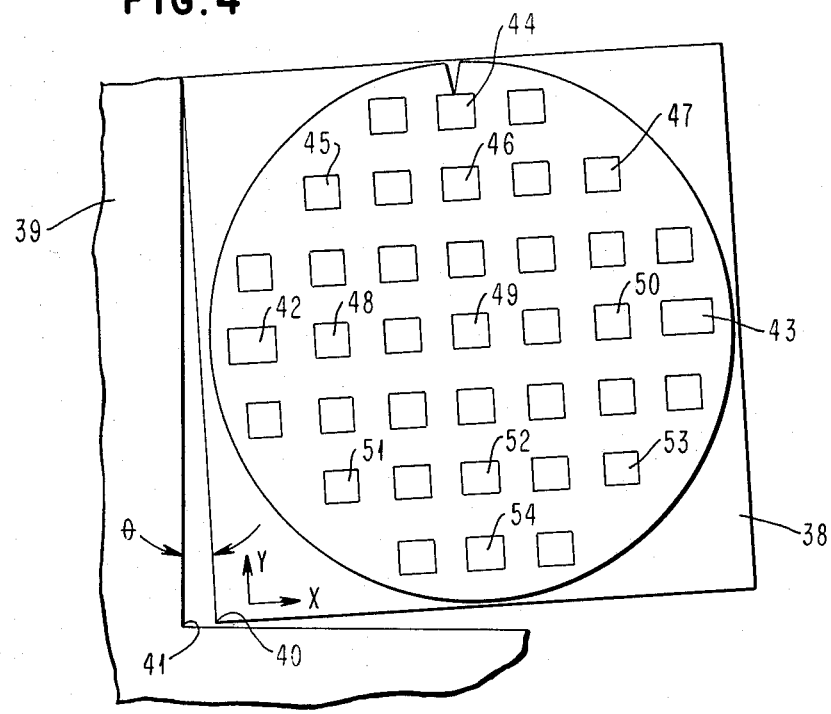
FIG. 4 shows the alignment mark sites and field sets of the first mask.

As shown in FIG. 4 a first mask 38 is placed in the stage 39 of a measuring system. Since such measuring systems are well known and commercially available it details are not shown.

For purposes of illustration only the mask 38 is shown as slightly mispositioned and skewed on the stage 39. Thus, the lower left corner 40 of the mask 38 is shown spaced apart from the internal corner 41, of the stage 39, into which the corner 40 should fit snugly.

Once the mask 38 is located on the stage 39 the X and Y coordinates of the center of alignment mark of the alignment field 42 is precisely located and measured by the machine and indicated below as X' and Y' with respect to the machine zero position 41, i.e., in terms of the machine coordinates. Similarly the center of the alignment mark appearing in the other alignment fields 43 is also measured in these machine coordinates.

From these measurements the angle which is the angle between edge of mask 38 and the edge of the stage 39 can be determined. Once this angle is determined the position of the center line between the two alignment fields 42 and 43 can be established in mask coordinates indicated below as X and Y in accordance with the following equations.

$$X - X_o = X'\cos\theta - Y'\sin\theta$$
$$Y - Y_o = Y'\cos\theta + X'\sin\theta$$
$$\tan\theta = \frac{X'_{43} - X'_{42}}{Y'_{43} - Y'_{42}}$$

Where:
X, Y are plate coordinates
X', Y' are machine coordinates
X, Y are offsets of two coordinate systems Thus the center of each of the alignment fields, 41 and 43, has now been related to the corner 40 of the mask on which the fields appear.

Once the mask coordinates of the fields 42 and 43 have been fixed with respect to the mask zero position, i.e., corner 40 of mask 38 the center of each of the other fields on the mask 38 is measured and established in with respect to the mask zero position.

The alignment fields mask coordinates are:

| Field | X | Y |
|---|---|---|
| 42 | 1.000015 | 3.999993 |
| 43 | 7.000005 | 4.000004 |

The following lists the mask coordinates of selected fields 44 through 54 in terms of the mask zero position.

| Field | X | Y |
|---|---|---|
| 44 | 3.999998 | 7.000005 |
| 45 | 2.000002 | 6.000000 |
| 46 | 3.999997 | 5.999999 |
| 47 | 5.999997 | 5.999995 |
| 48 | 2.000002 | 4.000000 |
| 49 | 3.999997 | 4.000001 |
| 50 | 5.999997 | 3.999997 |
| 51 | 2.000009 | 2.000006 |
| 52 | 3.999998 | 2.000003 |
| 53 | 5.999998 | 2.000001 |
| 54 | 4.000006 | 1.000004 |

It should be understood that the centers of all the fields would be so measured. When these measurements are completed the centroid of this data, i.e., the actual center of the mass of all the measured fields is established with respect to the design center of the plate.

In this case it will be assumed that this centroid of the measured fields is X=4.000008 and X=4.000002 and that the design centroid was X=4.000000 and Y=4.000000.

Once these values are determined the measured centroid is subtracted from the design centroid to establish the necessary correction delta thus $$\Delta x = 4.000000 - 4.000008 = -0.000008$$

$$\Delta y = 4.000000 - 4.000002 = -0.000002$$

This delta is now added to the measured values of the alignment fields 42 and 43 to reset the alignment fields so that the measured centroid will align with the design centroid.

Thus, the coordinates of the alignment fields are shifted to:

| Field | X | Y |
|---|---|---|
| 42 | 1.000007 | 3.999991 |
| 43 | 6.999997 | 4.000002 |

The next mask in the mask set is now treated in a similar way so that again the actual position of the center of each field and the centroid of all the fields on the mask can be determined.

This second mask is also placed in the X-Y coordinate measuring system.

Figure 5:
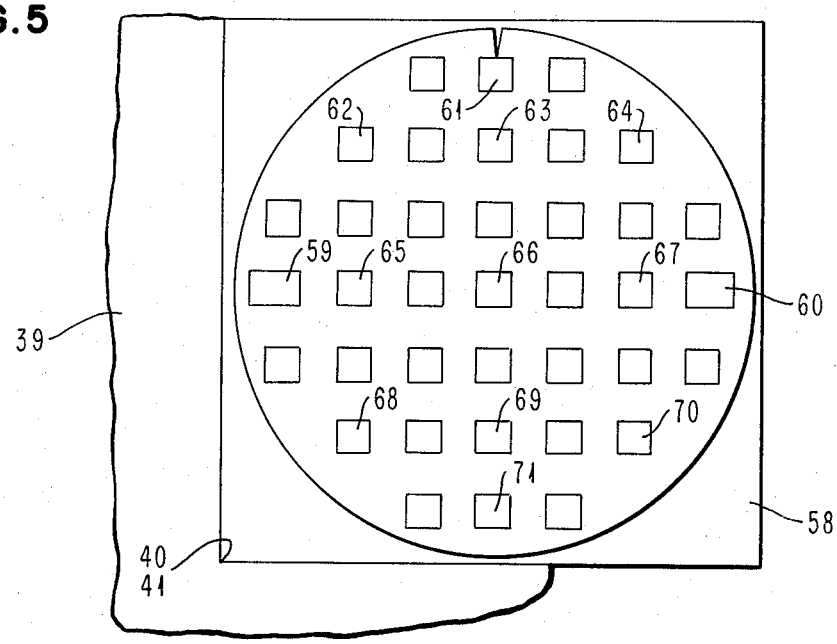
FIG. 5 shows the alignment mark sites and field sets of the second mask.

As shown in FIG. 5 the second mask 58 is placed in the stage 39 of the measuring system.

For purposes of illustration mask 58 is shown as properly fitted on the stage 39. Thus, the lower left corner 40 of the plate 58 is shown as snugly fitted in the internal corner 41, of the stage 39.

Once the mask 58 is located on the stage 39 the machine coordinates of the center of alignment mark of the alignment field 59 is precisely located and measured by the machine with respect to the machine zero position 41, i.e., in terms of the machine coordinates. Similarly the center of the alignment mask appearing in the other alignment field 60 is also measured in the machine coordinates. The angle between the edge of the mask 58 and the edge of the stage 39 in this case is zero. Thus, the center of each of the alignment fields is not only related to the corner 40 of the mask on which the fields appear, but also are the same with respect to the mask zero position.

The alignment fields mask coordinates are:

| Field | X | Y |
|---|---|---|
| 59 | 1.0000004 | 3.999999 |
| 60 | 6.999997 | 4.000002 |

The following lists the mask coordinates of selected fields 61 through 71 in terms of the mask zero position.

| Field | X | Y |
|---|---|---|
| 61 | 4.000004 | 7.000007 |
| 62 | 2.000005 | 6.000004 |
| 63 | 4.000002 | 6.000002 |
| 64 | 6.000003 | 6.000002 |
| 65 | 2.000006 | 3.999994 |
| 66 | 4.000000 | 3.999998 |
| 67 | 5.999997 | 4.000002 |
| 68 | 2.000011 | 2.000002 |
| 69 | 3.999994 | 1.999999 |
| 70 | 5.999994 | 2.000003 |
| 71 | 3.999994 | 0.999995 |

It should be understood that the centers of all the fields would be so measured. When these measurements are completed the centroid of this data, i.e., the actual center of the mass of all the measured fields is established with respect to the design center of the plate.

In this case the centroid of the measured field was determined to be $X=4.000000$ $Y=4.000002$. Again the design centroid would be 4.000000 and 4.000000.

Again the necessary correction delta is established by:

$$\Delta x = 4.000000 - 4.000000 = 0.000000$$

$$\Delta y = 4.000000 - 4.000002 = 0.000002$$

This delta is now added to the measured values of the alignment fields 59 and 60 to shift these alignment fields so that the measured centroid will align with the design centroid.

Thus the coordinates of the alignment fields are shifted to:

| 59 | 1.000004 | 3.999997 |
|---|---|---|
| 60 | 6.999997 | 4.000000 |

Thus having the shifted coordinates for alignment fields 42 and 43 of mask 38 and alignment fields 59 and 60 at mask 58 a net shift or correction is calculated for this mask set.

$$X_{42} - X_{59} = \Delta X_{59}$$

$$1.000007 - 1.000004 = -0.000006$$

$$Y_{42} - Y_{59} = \Delta Y_{59}$$

$$3.999991 - 3.999997 = -0.000005$$

$$X_{43} - X_{60} = \Delta X$$

$$6.999997 - 6.999997 = 0.000000$$

$$Y_{43} - Y_{60} = \Delta Y$$

$$4.000002 - 4.000000 = 0.000002$$

Figure 6:
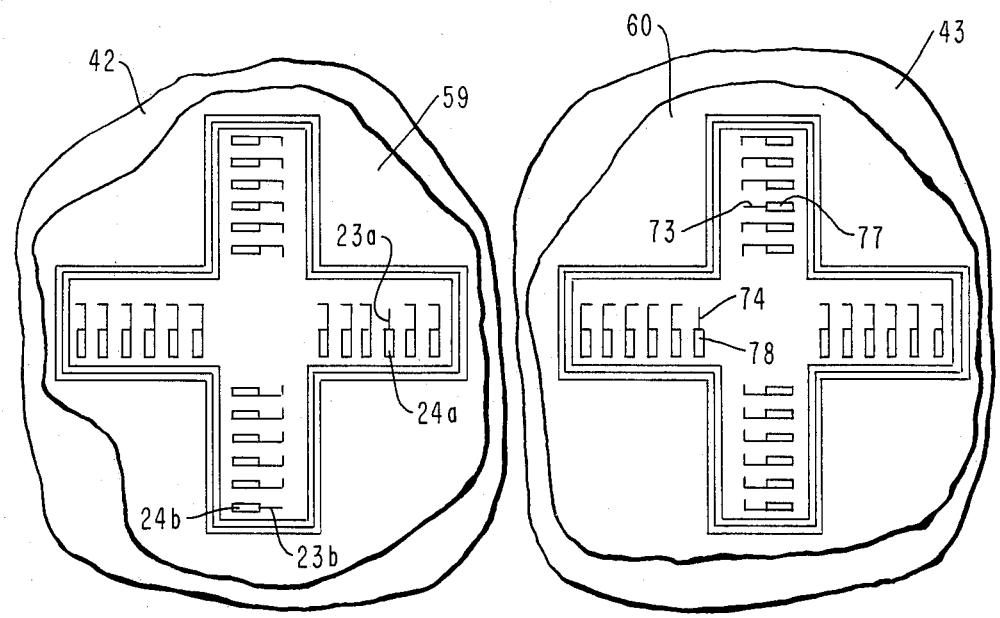
FIG. 6 shows the alignment of the scale of FIG. 3 properly positioned on the mask of FIG. 2 so as to minimize mismatch between the masks.

The customization process is to mark the alignment vernier to indicate which vernier to align. The vernier thus marked are superimposed on the alignment marks of the first mask as shown in FIG. 6.

The alignment mark in field 59 of the second mask is superimposed over the alignment mark 41 of the first mask such that the treated mark 23a is centrally positioned over the fourth mark 24a of the mark in alignment field 42 and the treated mark 23 is positioned over the sixth mark 24b of the mark in alignment field 42.

In a similar manner the mark in field 60 is positioned over the mark in field 43. In this case however the vernier 73 of the mark in field 60 is aligned with the vernier 77 of the mark in field 43. Similarly, vernier 74 is aligned with the vernier 78.

By so aligning the keyed vernier marks the overall average error of the mask fields on each mask set is brought to zero and the overall mismatch between the fields is minimized and achieves a best overlay.

Of course, it should be understood that variations in this technique could be practices. For examples, if one were to change the design of alignment mask sets and mark each mask with respect to the machine zero position, then the monitoring of each mask in a set could be eliminated, also a key application would be to use these shifted coordinates and cause an automatic type mask/wafer align-expose tool to shift or misalign by this amount at the two alignment fields.

We claim:

1. In a mask set comprised of a plurality of separate masks for producing integrated circuits, where each separate mask contains a plurality of similarly positioned images, a method of minimizing mismatch between the similarly positioned images provided on each mask in the set when the masks are assembled in a set and used to produce the circuits, comprising the steps of;

forming a first mask,
aligning said first mask to a fixed known standard,
determining the coordinates of the centroid of all image fields on said first mask,
forming a second mask,
aligning said second mask to said fixed known standard,
determining the coordinates of the centroid of all fields on said second mask, and
marking said second mask with respect to said first mask so that said second mask may be aligned with said first mask to cause the determined centroid of the second mask to overlie the determined centroid of the first mask to minimize the mismatch between the similarly positioned image fields on said first and said second masks and reduce the overall average error of the said similarly positioned image fields to zero.

2. In the mask set of claim 1 wherein:

each of said masks are formed with a multiplicity of similarly positioned image fields and at least two similarly positioned alignment fields designed with alignment indicators therein, and said marking of said second mask occurs in the alignment fields of said second mask and is with respect to the alignment fields of the said first mask so that when the marked alignment fields of the second mask is aligned with the alignment fields of the first mask mismatch between similarly positioned image fields on said first and said second masks is minimized and the overall average error of the said fields is reduced to zero.

3. In the mask set of claim 1 wherein:

each of said masks are formed with a multiplicity of image fields similarly positioned and at least two similarly positioned alignment fields, each such field having its center formed around a selected design coordinate, the coordinates of the center of each field on each mask is measured and, the coordinates of the centroid of the measured centers of all image fields on each mask is determined.

4. In the mask set of claim 2 wherein:

the alignment indicator in said alignment field on one of said masks comprises a plurality of spaced apart aligned bars.

5. In the mask set of claim 4 wherein:

the alignment indicator in said alignment field on the other of said masks comprises a plurality of lines having a spacing periodicity different from that of the bars on said one of said masks.

6. In the mask set of claim 5 wherein:

the number of lines of said other mask is equal to the number of bars on said one of said masks.

7. In the mask set of claim 6 wherein:

said bars are arranged in two distinct sequences at right angles to one another, and said lines are also arranged in two sequences at right angles to one another.

8. In the mask set of claim 7 wherein:

one line in each sequence is marked.

9. In the mask set of claim 8 wherein:

the marked line in each sequence is aligned with the center of the respective bar in the respective sequence of bars.

10. In the mask set of claim 9 wherein:

said bars and lines are arranged in the form of a cross.

* * * * *

UNITED STATES PATENT AND TRADEMARK OFFICE
CERTIFICATE OF CORRECTION

PATENT NO. : 4,388,386

DATED : June 14, 1983

INVENTOR(S) : Bruce D. King et al

It is certified that error appears in the above-identified patent and that said Letters Patent are hereby corrected as shown below:

Column 1, line 18, change "resistor" to --transistor--.

Column 1, line 25, change "claims" to --drains--.

Column 1, line 35, change "mask" to --mark--.

Column 1, line 45, cancel "best overlay".

Column 2, ling 10, cancel "and".

Column 2, line 12, following "mask", cancel "." insert --, and--.

Column 2, line 35, change "repeat" to --respect--.

Column 2, line 56, change "mark" to --marks,--.

Column 2, line 56, following "14b" insert --,--.

Column 3, line 21, change "is" to --are--.

Column 3, line 27, change "mark" to --mask--.

UNITED STATES PATENT AND TRADEMARK OFFICE
CERTIFICATE OF CORRECTION

PATENT NO. : 4,388,386

DATED : June 14, 1983

INVENTOR(S) : Bruce D. King et al

It is certified that error appears in the above-identified patent and that said Letters Patent are hereby corrected as shown below:

Column 3, line 65, change "X, Y are offsets" to
--$X_O$, $Y_O$ are offsets--.

Column 4, line 1, change "41" to --42--.

Column 4, line 7, cancel "in".

Column 4, line 35, cancel "of the mass".

Column 4, line 38, change "X=4.000002" to --Y=4.000002--.

Column 6, line 23, change "41" to --42--.

Column 6, line 26, change "23" to --23b--.

UNITED STATES PATENT AND TRADEMARK OFFICE
CERTIFICATE OF CORRECTION

PATENT NO. : 4,388,386

DATED : June 14, 1983

INVENTOR(S) : Bruce D. King et al

It is certified that error appears in the above-identified patent and that said Letters Patent are hereby corrected as shown below:

In the Claims

Claim 2, line 15, change "is" to --are--.

Signed and Sealed this

Twenty-third Day of April 1985

[SEAL]

Attest:

DONALD J. QUIGG

Attesting Officer

Acting Commissioner of Patents and Trademarks